United States Patent
Chang et al.

(10) Patent No.: US 11,651,967 B2
(45) Date of Patent: *May 16, 2023

(54) NON-ATOMIC LAYER DEPOSITION (ALD) METHOD OF FORMING SIDEWALL PASSIVATION LAYER DURING HIGH ASPECT RATIO CARBON LAYER ETCH

(71) Applicant: Tokyo Electron Limited, Tokyo (JP)

(72) Inventors: Shihsheng Chang, Albany, NY (US); David O'Meara, Albany, NY (US); Andrew Metz, Albany, NY (US); Yun Han, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/514,233

(22) Filed: Oct. 29, 2021

(65) Prior Publication Data
US 2022/0189781 A1    Jun. 16, 2022

Related U.S. Application Data

(63) Continuation of application No. 17/119,019, filed on Dec. 11, 2020.

(51) Int. Cl.
| H01L 21/306 | (2006.01) |
| H01L 21/3065 | (2006.01) |
| H01L 21/033 | (2006.01) |
| H01J 37/305 | (2006.01) |
| H01J 37/32 | (2006.01) |
| H01L 21/02 | (2006.01) |

(52) U.S. Cl.
CPC ...... *H01L 21/3065* (2013.01); *H01J 37/3053* (2013.01); *H01J 37/32082* (2013.01); *H01L 21/02115* (2013.01); *H01L 21/0337* (2013.01)

(58) Field of Classification Search
None
See application file for complete search history.

(56) References Cited

U.S. PATENT DOCUMENTS

2019/0221441 A1*    7/2019    Jiang ................. H01J 37/32522

* cited by examiner

*Primary Examiner* — Roberts P Culbert

(57) ABSTRACT

Improved process flows and methods are provided herein for forming a passivation layer on sidewall surfaces of openings formed in an amorphous carbon layer (ACL) to avoid bowing during an ACL etch process. More specifically, improved process flows and methods are provided to form a silicon-containing passivation layer on sidewall surfaces of the openings created within the ACL without utilizing atomic layer deposition (ALD) techniques or converting the silicon-containing passivation layer to an oxide or a nitride. As such, the improved process flows and methods disclosed herein may be used to protect the sidewall surfaces of the ACL and prevent bowing during the ACL etch process, while also reducing processing time and improving throughput.

20 Claims, 8 Drawing Sheets

US 11,651,967 B2

NON-ATOMIC LAYER DEPOSITION (ALD) METHOD OF FORMING SIDEWALL PASSIVATION LAYER DURING HIGH ASPECT RATIO CARBON LAYER ETCH

RELATED APPLICATIONS

This continuation application claims the benefit of priority from U.S. Nonprovisional patent application Ser. No. 17/119,019, filed Dec. 11, 2020, the entire disclosure of which is incorporated herein by reference.

BACKGROUND

The present disclosure relates to the processing of substrates. In particular, it provides a novel method and process flow for forming a passivation layer on sidewall surfaces of an amorphous carbon layer (ACL) to avoid bowing during an ACL etch process.

As geometries in substrate processing continue to shrink, the technical challenges to forming structures on substrates via photolithography and etch techniques increase. As requirements for smaller geometry structures arose, a variety of techniques have been utilized for achieving suitable structures. Although reduced feature sizes are achieved, pattern performance problems have occurred in some conventional small geometry patterning and etch methods.

For example, photolithography techniques have been used to transfer patterns from a patterned layer to an organic mask layer, such as an amorphous carbon layer (ACL) film, underlying the patterned layer. ACL films are often used as a hard mask for patterning underlying layers using a variety of small geometry patterning methods. However, as feature sizes decrease, critical dimensions ("CDs") become smaller and aspect ratios increase, leading to increasingly greater etch depths. Accordingly, high ion energy is often required to etch high-aspect ratio features (such as vias, contact holes and lines) in ACL films and underlying layers. When etching high-aspect ratio features, the thickness of the ACL film may be increased to withstand etching of the underlying layers. Increasing the thickness of the ACL, however, can create defects in the etched features.

For example, "bowing" may occur when conventional pattern transfer techniques are used to etch high-aspect ratio features in ACL films. Bowing occurs when plasma ions bombard sidewall surfaces of the ACL film to laterally etch the sidewall surfaces. The "bow CD" is measurement of bowing, which is generally defined as the cross-section or width of an opening formed in a layer in a direction perpendicular to the thickness of the layer. When bowing occurs, the bow CD is typically larger near the top of the layer than the bottom of the layer.

FIG. 1 (PRIOR ART) illustrates how bowing may occur when conventional pattern transfer processes are used to etch high-aspect features in an ACL film. As shown in FIG. 1, patterned substrate 100 may generally include a patterned layer 108 formed over a hard mask layer 106, which in turn, is formed over one or more underlying layers, such as an oxide layer 104 and base substrate layer 102. The patterned layer 108, oxide layer 104 and base substrate layer 102 may be formed from any of a wide variety of materials, as is known in the art. The hard mask layer 106 is an amorphous carbon layer (ACL) film, which is used as a hard mask for transferring a pattern from the patterned layer 108 to the underlying oxide layer 104.

In conventional pattern transfer processes, the patterned substrate 100 is exposed to light during a lithography step, and a wet or dry etch process is performed after the lithography step to remove the exposed portions of the hard mask layer 106 to create openings 110. When a dry process is used, a process gas is converted by high-energy power into plasma and ions, which bombard exposed portions of the hard mask layer 106. Although ion bombard is primarily anisotropic, ion scattering caused by collision of molecules in the plasma may lead to lateral etching of the opening 110 sidewalls and bowing. As shown in FIG. 1, the bow CD is generally larger near the top of the hard mask layer 106 underlying the patterned layer 108. When significant bowing occurs, the hard mask layer 106 may collapse, closing the openings 110.

FIGS. 2A-2D illustrate a conventional solution used to prevent bowing during an ACL etch process. In FIG. 2A, a patterned substrate 200 is formed including a patterned layer 208, a hard mask layer 206, an oxide layer 204 and a base substrate layer 202, as described above in reference to FIG. 1. In FIG. 2B, the patterned substrate 200 is exposed to light during a lithography step, and a dry etch process 212 is performed to remove exposed portions of the hard mask layer 206 to create openings 210. In some embodiments, the dry etch process 212 shown in FIG. 2B may remove some, but not all, of the exposed portions of the hard mask layer 206. For example, the dry etch process 212 may be configured to etch the exposed portions of the hard mask layer 206 to a first etch depth (d1).

In FIG. 2C, a passivation layer 216 is deposited onto the bottom and sidewall surfaces of the openings 210 formed in the hard mask layer 206 to prevent the sidewall surfaces of the hard mask layer 206 from bowing when the dry etch process 212 is resumed in FIG. 2D. In conventional ACL etch processes, an atomic layer deposition (ALD) process 214 or other plasma process is commonly used to deposit a silicon layer onto the bottom and sidewall surfaces of the hard mask layer 206. Once the silicon layer is deposited, the ALD process 214 may expose the patterned substrate 200 to a nitrogen- or oxygen-containing gas and/or plasma to convert the silicon layer into a silicon oxide or silicon nitride passivation layer 216. Then the dry etch process 212 may be resumed. When the dry etch process 212 is subsequently resumed (in FIG. 2D), the passivation layer 216 protects the sidewall surfaces of the hard mask layer 206 from ion bombardment and lateral etching. While such processes reduce bowing and result in substantially vertical openings 210, ALD processes are relatively time consuming, and thus, reduce throughput.

As known in the art, atomic layer deposition (ALD) is a process wherein conventional chemical vapor deposition (CVD) processes are divided into separate deposition steps to construct a thin film by sequentially depositing single atomic monolayers in each deposition step. The ALD technique is based on the principle of the formation of a saturated monolayer of reactive precursor molecules by chemisorption. A typical ALD process consists of injecting a first precursor for a period of time until a saturated monolayer is formed on the substrate. Then, the first precursor is purged from the chamber using an inert gas to prevent the first precursor from mixing with a subsequent precursor gas species. After the chamber is purged, a second precursor is injected into the chamber, also for a period of time, thus forming a layer on the substrate from the reaction of the second precursor with the monolayer formed on the substrate. Then, the second precursor is purged from the chamber and the process of introducing the first precursor, purging the process chamber, introducing the second precursor, and purging the process chamber is often repeated a number of times to achieve a desired film thickness.

A wide range of ALD processes have been used to form ALD passivation layers on sidewall surfaces of hard mask layers. For example, ALD processes have been used to form silicon dioxide ($SiO_2$) passivation layers on the sidewall surfaces of hard mask layers by utilizing a cyclical process of exposing the substrate to a silicon precursor gas (e.g., silanes) followed by exposure to an oxygen-containing gas (e.g., oxygen, $O_2$, ozone, $O_3$, etc.). Other ALD processes have been used to form silicon nitride (SiN) passivation layers on the sidewall surfaces of hard mask layers by exposing the substrate to a silicon precursor gas (e.g., silanes) followed by exposure to an nitrogen-containing gas (e.g., nitrogen, $N_2$, ammonia, $NH_3$, etc.) in a cyclical process. In either case, the cyclical process of introducing a silicon precursor gas, purging the chamber, introducing the oxygen- or nitrogen-containing gas and purging the chamber is time consuming. Thus, throughput is reduced when ALD processes are used to form passivation layers on the sidewall surfaces of hard mask layers. Further, the ALD processes may contribute to sidewall roughness which may negatively impact the performance of the formed structures such as vias or contact holes.

As such, a need exists for an improved process and method for forming a passivation layer on sidewall surfaces of an amorphous carbon layer (ACL) to avoid bowing during an ACL etch process.

SUMMARY

Improved process flows and methods are provided herein for forming a passivation layer on sidewall surfaces of openings formed in an amorphous carbon layer (ACL) to avoid bowing during an ACL etch process. More specifically, improved process flows and methods are provided to form a silicon-containing passivation layer on sidewall surfaces of the openings created within the ACL without utilizing atomic layer deposition (ALD) techniques or converting the silicon-containing passivation layer to an oxide or a nitride. As such, the improved process flows and methods disclosed herein may be used to protect the sidewall surfaces of the ACL and prevent bowing during the ACL etch process, while also reducing processing time and improving throughput.

In one embodiment, a method for patterning a substrate is provided. The method may comprise forming an amorphous carbon layer (ACL) on one or more underlying layers formed on the substrate, wherein a thickness of the ACL is greater than 1 micrometer (μm) and forming a patterned layer over the ACL. The method further comprises etching exposed portions of the ACL not covered by the patterned layer to create openings in the ACL, wherein the exposed portions of the ACL are partially etched to a first depth, which is less than the thickness of the ACL. The method further comprises forming a silicon-containing passivation layer on sidewall surfaces of the openings created in the ACL by exposing the substrate to a silicon-containing precursor. The method then comprises continuing etching the exposed portions of the ACL to a second depth, which is greater than the first depth, without converting the silicon-containing passivation layer to an oxide or a nitride.

Variations of the method described above may be performed wherein said forming the silicon-containing passivation layer comprises exposing the substrate to the silicon-containing precursor in an absence of plasma to deposit a silicon monolayer on the sidewall surfaces of the openings created in the ACL. In another variation, said forming the silicon-containing passivation layer further comprises: (1) subsequently exposing the substrate to a hydrogen plasma to change a surface property of the silicon monolayer; and (2) repeating said exposing the substrate to the silicon-containing precursor in the absence of plasma and said subsequently exposing the substrate to the hydrogen plasma a number of times to form a plurality of silicon monolayers on the sidewall surfaces of the openings. In another variation, an atomic layer deposition (ALD) process is not used to deposit the silicon monolayer.

In yet another variation, said exposing the substrate to the silicon-containing precursor in the absence of plasma comprises: (1) providing the substrate within a plasma chamber coupled to a first radio frequency (RF) source and a second RF source; and (2) supplying the silicon-containing precursor to the plasma chamber without supplying power from the first RF source or the second RF to the plasma chamber. In still another embodiment, said providing the substrate within the plasma chamber comprises providing the substrate within a capacitively coupled plasma (CCP) chamber or an inductively coupled plasma (ICP) chamber.

In another embodiment, the silicon-containing precursor comprises an aminosilane. In yet another embodiment, the silicon-containing precursor comprises di-isopropylaminosilane. In some embodiments, the method further comprises repeating said forming the silicon-containing passivation layer on sidewall surfaces of the openings and said continuing etching the exposed portions of the ACL a number of cycles and/or until the exposed portions of the ACL are completely removed. In some embodiments, the number of cycles is 5 or more.

In a second embodiment, a method for patterning a substrate is provided. The method comprises: forming an amorphous carbon layer (ACL) on one or more underlying layers formed on the substrate, wherein a thickness of the ACL is greater than 1 micrometer (μm); forming a patterned mask layer over the ACL; and etching exposed portions of the ACL not covered by the patterned mask layer to create openings in the ACL, wherein the exposed portions of the ACL are partially etched to a first depth, which is less than the thickness of the ACL. The method further comprises exposing the substrate to a silicon-containing precursor in an absence of plasma to form a silicon monolayer on sidewall surfaces of the openings created in the ACL, and subsequently exposing the substrate to a hydrogen plasma to change a surface property of the silicon monolayer. The method also comprises forming a plurality of silicon monolayers on the sidewall surfaces of the openings by repeating said exposing the substrate to the silicon-containing precursor in the absence of plasma and said subsequently exposing the substrate to the hydrogen plasma a number of times. The method also comprise continuing etching the exposed portions of the ACL to a second depth, which is greater than the first depth.

The second embodiment may further comprise repeating said forming the plurality of silicon monolayers on the sidewall surfaces of the openings and said continuing etching the exposed portions of the ACL a number of cycles and/or until the exposed portions of the ACL are completely removed. In alternative, an atomic layer deposition (ALD) process is not used to form the silicon monolayer or the plurality of silicon monolayers. The second embodiment may further include said exposing the substrate to the silicon-containing precursor in the absence of plasma comprising: (1): providing the substrate within a plasma chamber coupled to a first radio frequency (RF) source and a second RF source; and (2) supplying the silicon-containing precursor to the plasma chamber without supplying power from the first RF source or the second RF to the plasma chamber. In another variation, said providing the substrate within the plasma chamber comprises providing the substrate within a capacitively coupled plasma (CCP) chamber or an inductively coupled plasma (ICP) chamber. In some variations, the silicon-containing precursor comprises an aminosilane. In some variations the silicon-containing precursor comprises di-isopropylaminosilane. In some variations, the plurality of silicon monolayers are not converted to an oxide or a nitride. In some variations, the number of times is three or more.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
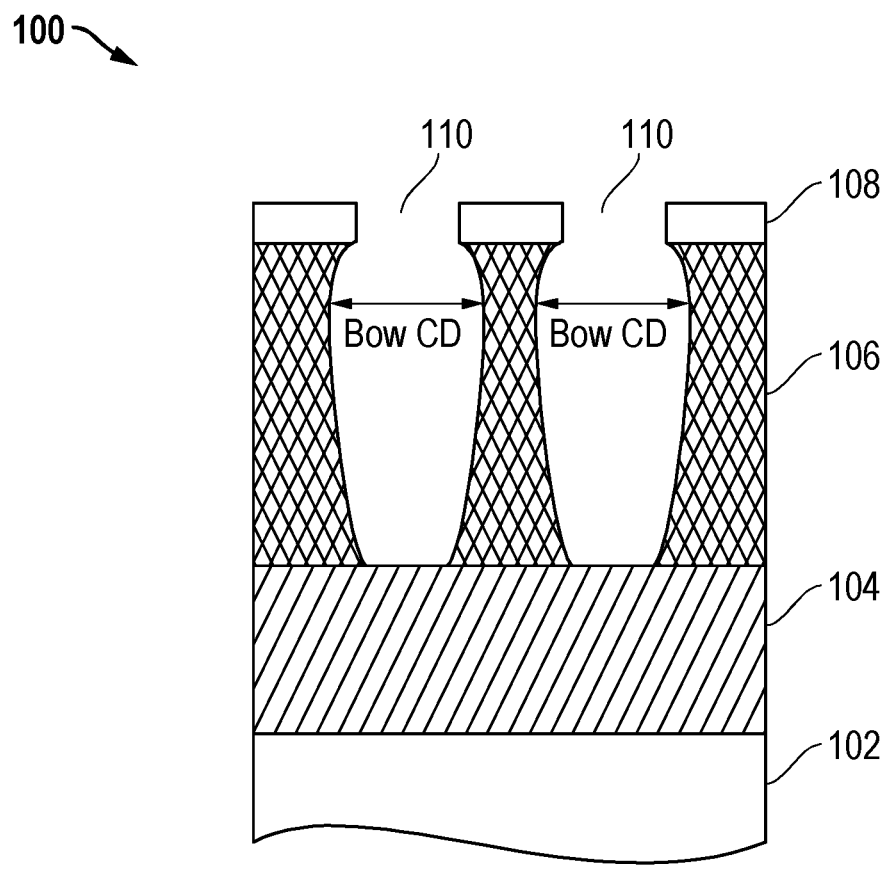
FIG. 1 (PRIOR ART) is a cross-sectional view of a patterned substrate illustrating the bowing that occurs when conventional pattern transfer processes are used to etch high-aspect features in an amorphous carbon layer (ACL) film.
Figure 2A:
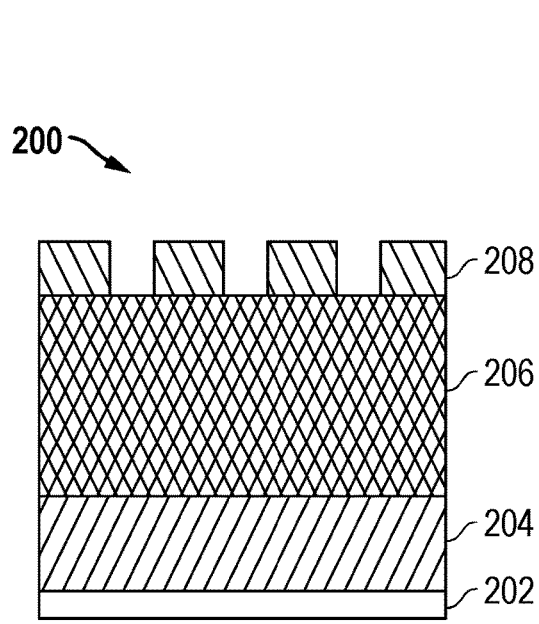
FIGS. 2A-2D (PRIOR ART) illustrate a conventional pattern transfer process that prevents bowing during an ACL etch process by depositing a passivation layer onto sidewall surfaces of the ACL film using an atomic layer deposition (ALD) process.
Figure 2B:
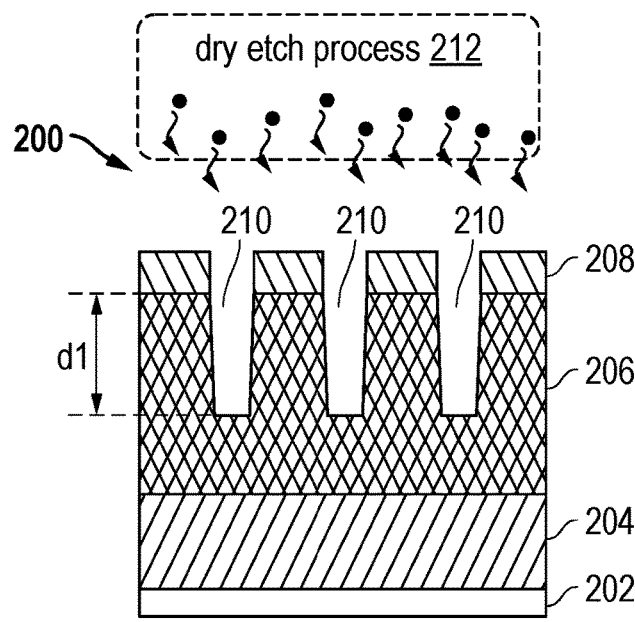
Figure 2C:
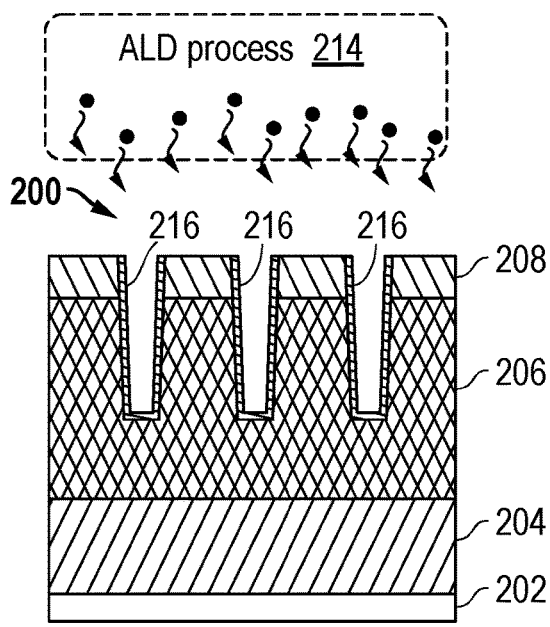
Figure 2D:
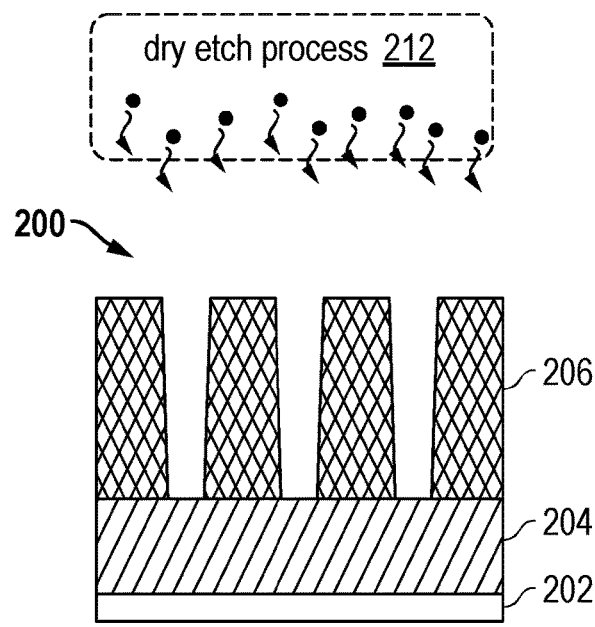

Improved process flows and methods are provided herein for forming a passivation layer on sidewall surfaces of openings formed in an amorphous carbon layer (ACL) to avoid bowing during an ACL etch process. More specifically, improved process flows and methods are provided to form a silicon-containing passivation layer on sidewall surfaces of the openings created within the ACL without utilizing atomic layer deposition (ALD) techniques or converting the silicon-containing passivation layer to an oxide or a nitride. As such, the improved process flows and methods disclosed herein may be used to protect the sidewall surfaces of the ACL and prevent bowing during the ACL etch process, while also reducing processing time and improving throughput.

In the present disclosure, a patterned substrate is provided with an amorphous carbon layer (ACL), which is formed on one or more underlying layers, and a patterned layer formed over the ACL. In some embodiments, a thickness of the ACL may be greater than 1 micrometer (μm). After partially etching exposed portions of the ACL to a first depth to create openings within the ACL, the improved process flows and methods disclosed herein form a silicon-containing passivation layer on sidewall surfaces of the openings by exposing the patterned substrate to a silicon-containing precursor gas. In some embodiments, the silicon-containing precursor gas may comprise an aminosilane precursor, such as but not limited to, di-isopropylaminosilane ($SiH_3N(C_3H_7)_2$, otherwise referred to as LTO520). Other aminosilane and silicon-containing precursor gases may also be used. For example, other precursors may include, but are not limited to, tetraethoxysilane (TEOS), tetramethoxysilane (TMOS), dichlorosilane (DCS), tetrachlorosilane ($SiCl_4$), etc.

In a first embodiment, the silicon-containing passivation layer may be formed by exposing the patterned substrate to the silicon-containing precursor gas in the absence of plasma to deposit a silicon monolayer on the sidewall surfaces of the openings created in the ACL. This may be achieved, in some embodiments, by providing the patterned substrate within a plasma chamber coupled to a first radio frequency (RF) source and a second RF source, and supplying the silicon-containing precursor to the plasma chamber without supplying power from the first RF source or the second RF to the plasma chamber. In some embodiments, the plasma chamber may be a capacitively coupled plasma (CCP) chamber or an inductively coupled plasma (ICP) chamber. However, such chambers are exemplary and other deposition chambers and techniques, including non-plasma chambers may be utilized.

In a second embodiment, the silicon-containing passivation layer may be formed by: (a) exposing the patterned substrate to the silicon-containing precursor gas in the absence of plasma to form a silicon monolayer on the sidewall surfaces of the openings created in the ACL, (b) subsequently exposing the substrate to a hydrogen plasma to change a surface property of the silicon monolayer, and (c) repeating the steps of exposing the substrate to the silicon-containing precursor in the absence of plasma and subsequently exposing the substrate to a hydrogen plasma a number of times to form a plurality of silicon monolayers on the sidewall surfaces of the openings.

After the silicon-containing passivation layer is formed, the improved process flows and methods disclosed herein continue etching the exposed portions of the ACL to a second depth, which is greater than the first depth. If the second depth is less than the thickness of the ACL, the improved process flows and methods disclosed herein may repeat the process of forming silicon-containing passivation layer(s) on the sidewall surfaces of the openings and continue etching the exposed portions of the ACL for a number of cycles and/or until the exposed portions of the ACL are completely removed.

Unlike conventional processes, the silicon-containing passivation layer described herein is formed without utilizing atomic layer deposition (ALD) techniques or converting the silicon-containing passivation layer to an oxide or a nitride. Thus, the disclosed process flows and methods protect the sidewall surfaces of the ACL and prevent bowing during the ACL etch process, while reducing processing time and improving throughput. In the first embodiment, better clogging margin may be achieved by using a thinner passivation layer (i.e., a silicon monolayer). However, better sidewall protection may be achieved in the second embodiment by alternating between non-plasma and plasma processes to build the silicon monolayers up to provide a substantially thicker passivation layer.

FIGS. 3A-3E illustrate one embodiment of an improved process flow that utilizes the techniques disclosed herein. It will be recognized that the embodiment shown in FIGS. 3A-3E is merely exemplary and the techniques described herein may be applied to other process flows.

Figure 3A:
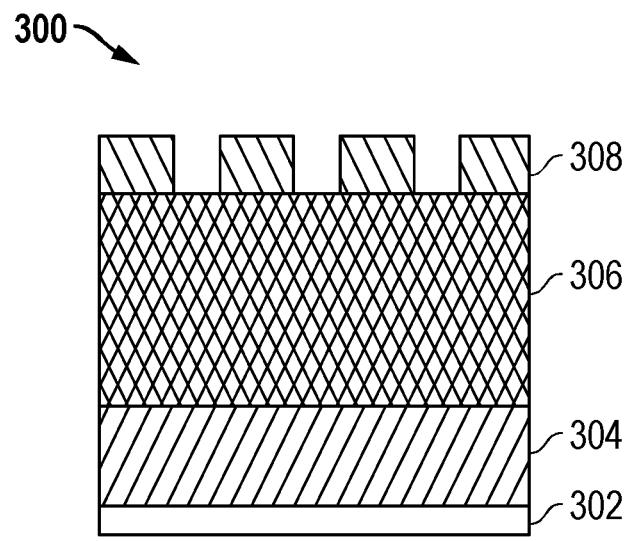
FIGS. 3A-3E illustrate an improved pattern transfer process that prevents bowing during an ACL etch process by depositing a passivation layer onto sidewall surfaces of the ACL film without utilizing atomic layer deposition (ALD) techniques.

As shown in FIG. 3A, patterned substrate 300 includes a patterned layer 308 formed over an amorphous carbon layer (ACL) 306, which in turn, is formed over one or more underlying layers. In some embodiments, the one or more underlying layers may include an oxide layer 304 and a base substrate 302, as shown in FIG. 3A. As shown and described, the base substrate 302 may be composed of a variety of patterned and unpatterned layers that were formed in prior non-shown processing steps, as is well known in the substrate processing art. It is recognized, however, that the underlying layers shown in the figures and described herein are merely exemplary, and more, less or other underlying layers may be utilized. Further, it will be recognized that for illustrative purposes to aid showing the various layers, the thicknesses of the underlying layers in the figures may be shown to be much thinner than thicknesses actually used.

Base substrate 302 may be any substrate for which the use of patterned features is desirable. For example, base substrate 302 may be a semiconductor substrate having one or more semiconductor processing layers formed thereon. In one embodiment, base substrate 302 may be a substrate that has been subject to multiple semiconductor processing steps which yield a wide variety of structures and layers, all of which are known in the substrate processing art.

Oxide layer 304 may be formed from any of a wide variety of materials, as is known in the art. In one embodiment, the oxide layer 304 may be any of a variety of oxide containing layers, such as but not limited to, a silicon dioxide ($SiO_2$) layer, a multi-layered oxide-nitride-oxide-nitride (ONON), a multi-layered oxide-polysilicon-oxide-polysilicon (OPOP), or layers containing an oxide. Oxide layer 304 may be formed using any of a wide variety of deposition processes as is well known in the art, such as but not limited to, chemical vapor deposition (CVD), plasma-enhanced chemical vapor deposition (PECVD), physical vapor deposition (PVD), capacitively coupled plasma (CCP) deposition, inductively coupled plasma (ICP) deposition, spin-on processes, atomic layer deposition (ALD), etc. In one embodiment, a silicon containing oxide layer is formed using TEOS chemical vapor deposition techniques. In some embodiments, one or more layers may be formed above and/or below the oxide layer 304 shown in FIG. 3A.

ACL 306 may also be formed from any of a wide variety of materials using any of a wide variety of deposition processes, as is known in the art. Examples of deposition processes that may be used to form ACL 306 include, but are not limited to, chemical vapor deposition (e.g., CVD, PECVD), physical vapor deposition (PVD), plasma deposition (e.g., CCP, ICP), spin-on processes, etc. In one or more of the deposition processes described above, ACL 306 may be deposited by exposing the patterned substrate 100 to a gas mixture comprising a hydrocarbon gas (e.g., $C_xH_y$) and an inert gas (e.g., $N_2$, Ar, He, Ne, Kr, Xe, etc.), possibly in combination with other gas sources, such as for example, a hydrogen-containing gas (e.g., $H_2$), a nitrogen-containing gas (e.g., $N_2$, $NH_3$), etc.

In some embodiments, ACL 306 is used as a hard mask layer for etching high-aspect ratio features (such as vias, contact holes and lines) in one or more of the underlying layers. When etching high-aspect ratio features, the thickness of the ACL 306 may be increased to withstand etching of the ACL 306 and the one or more underlying layers. In some embodiments, the thickness (T) of the ACL 306 may be greater than 1 µm (micrometer). For example, the thickness of the ACL 306 may range between 1 µm and 4 µm. Further, feature widths and spaces of 300 nm or smaller and even 70 nm or smaller may be necessary to be formed in the ACL 306. Thus, high aspect ratio features may need to be formed in the ACL 306. Thus, aspect ratios of 10, 50 or even higher may be formed.

After ACL 306 is formed, a patterned layer 308 may be formed on the ACL 306 by depositing one or more material layers onto the ACL 306 and then patterning the material layer(s) using a lithography technique. A variety of deposition processes and a variety of lithography techniques may be used to form the patterned layer 308, as is well known in the art. In addition, the patterned layer 308 may generally be formed from any of a wide variety of mask materials commonly used in lithography. For example, the patterned layer 308 may comprise a photoresist layer or other mask layers (for instance a mask layer that was patterned from a photoresist lithography and etch process as is known in the art), etc.

Figure 3B:
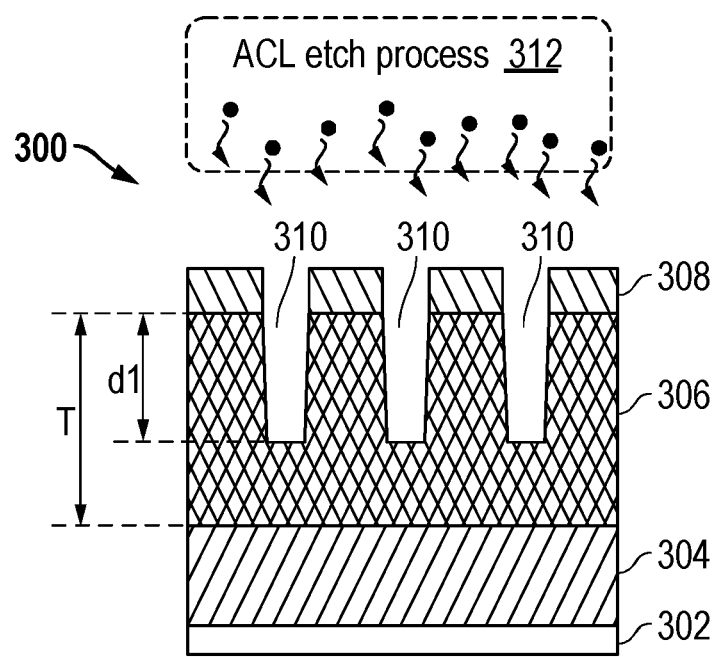

After the patterned layer 308 is formed, an ACL etch process 312 may be performed to remove exposed portions of the ACL 306 (i.e., portions of the ACL 306 not protected by the patterned layer 308) to create openings 310 in the ACL 306. As shown in FIG. 3B, the ACL etch process 312 may be configured to partially etch the exposed portions of the ACL 306 to a first depth (d1), which is less than the thickness (T) of the ACL 306.

Various etch chemistries may be used in the ACL etch process 312 shown in FIG. 3B. In some embodiments, for example, an etch chemistry comprising sulfur and oxygen may be used to etch the exposed portions of the ACL 306. Examples of sulfur and oxygen containing etch chemistries include, but are not limited to, chemistries comprising sulfur dioxide ($SO_2$), carbonyl sulfide (COS), carbon monoxide (CO), carbon dioxide ($CO_2$), nitrogen ($N_2$), and/or hydrogen ($H_2$) In some embodiments, an oxygen-containing gas (e.g., $O_2$, $O_3$) and/or an inert gas (e.g., $N_2$, Ar, He, Ne, Kr, Xe, etc.) may be added to the etch chemistry used in the ACL etch process 312. Further, any of a wide variety of chemistries utilized for ACL etching may be utilized, as the techniques disclosed herein are not limited to a particular chemistry. The techniques described herein are not limited, however, to any particular ACL etch chemistries.

In one example embodiment, the ACL etch process 312 shown in FIG. 3B may be configured to supply a gas mixture comprising approximately 200 to 300 standard cubic centimeters (sccm) of sulfur dioxide ($SO_2$), approximately 80 to 150 sccm of oxygen ($O_2$) and approximately 20 to 80 sccm of argon (Ar) to a plasma chamber (e.g., a CCP or ICP chamber) in which the patterned substrate 100 is disposed. As known in the art, a plasma may be generated within the plasma chamber by supplying source power from a first radio frequency (RF) source and/or bias power from a second RF source to the plasma chamber, while the gas mixture is supplied to the plasma chamber. In some embodiments, relatively high source power (e.g., 1000 to 1400 W), relatively low bias power (e.g., 100 to 600 W), relatively low chamber pressure (e.g., 10 to 30 mT) and relatively low temperature (e.g., 0 to 60° C.) may be used to generate the plasma within the plasma chamber. During the ACL etch process 312, ions generated within the plasma bombard the exposed portions of the ACL 306 to etch or remove the exposed portions of the ACL 306 to create openings 310.

As noted above, the ACL etch process 312 shown in FIG. 3B may be configured to partially etch the exposed portions of the ACL 306 to a first depth (d1), which is less than the thickness (T) of the ACL 306. In some embodiments, the ACL etch process 312 may be timed to etch the exposed portions of the ACL 306 to the first depth (d1). The etch time and the etch depth may be dependent on several factors, such as the thickness (T) of the ACL 306, the material composition of the ACL 306, the etch chemistry, etc. In some embodiments, the etch time may range between 1 to 4 minutes to achieve a first etch depth (d1) of 500 to 2000 nm. Other etch times and etch depths may also be used.

After partially etching the exposed portions of the ACL 306 to create openings 310 in FIG. 3B, a silicon-containing passivation layer 316 may be formed on sidewall surfaces of the openings 310 by exposing the patterned substrate 100 to a silicon-containing precursor 314. In some embodiments, the silicon-containing precursor 314 may comprise an aminosilane precursor, such as but not limited to, di-isopropylaminosilane ($SiH_3N(C_3H_7)_2$, otherwise referred to as LTO520). Other aminosilane and silicon-containing precursor gases may also be used. For example, other precursors may include, but are not limited to, TEOS, TMOS, DCS, $SiCl_4$, etc. However, other aminosilane and silicon-containing precursors may also be used.

Silicon-containing passivation layer 316 may be formed using any of a wide variety of deposition processes, such as but not limited to, chemical vapor deposition (e.g., CVD, PECVD), physical vapor deposition (PVD), and plasma deposition (e.g., CCP, ICP) processes. The silicon-containing passivation layer 316, however, does not need to be formed as part of an atomic layer deposition (ALD) process. As noted above, ALD processes build up monolayers on a substrate surface by alternately exposing the substrate to a first precursor and a second precursor, while purging the processing chamber in between precursor gas exposure to prevent the first and second precursors from mixing. For example, conventional ALD processes have been used to form silicon dioxide ($SiO_2$) or silicon nitride (SiN) passivation layers on sidewall surfaces of hard mask layers by alternately exposing the substrate to a silicon precursor gas (e.g., silanes) followed by exposure to an oxygen-containing gas (e.g., $O_2$, $O_3$, etc.) or a nitrogen-containing gas (e.g., $N_2$, $NH_3$, etc.). These ALD processes are time consuming and limit throughput.

Figure 3C:
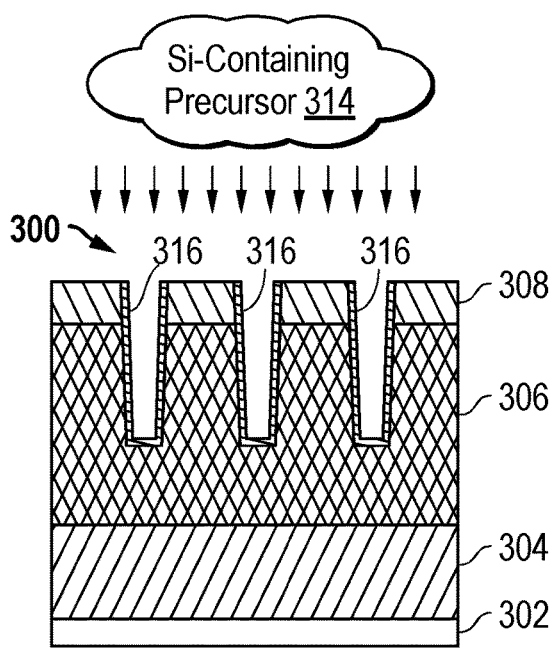

In one embodiment, the silicon-containing passivation layer 316 shown in FIG. 3C may be formed on sidewall surfaces of the openings 310 using a plasma deposition (e.g., CCP, ICP) process. However, the silicon-containing passivation layer 316 is preferably formed by exposing the patterned substrate 100 to the silicon-containing precursor 314 in the absence of plasma to deposit a silicon monolayer on the sidewall surfaces of the openings 310, as shown schematically in FIG. 3C. This may be achieved, in some embodiments, by supplying the silicon-containing precursor 314 to a plasma chamber (e.g., a CCP or ICP chamber) in which the patterned substrate 100 is disposed without supplying source or bias power to the plasma chamber. Non-plasma based chambers may also be utilized if desired for the passivation formation. Advantageously for throughput issues, it is desirable, however, to utilize the same chamber for the sidewall passivation formation and the etching of ACL 306. Thus, in one exemplary embodiment described herein all the processes (etch and passivation formation) are performed in-situ in a single process chamber.

In one example embodiment, the silicon-containing passivation layer 316 may be formed on sidewall surfaces of the openings 310 by supplying a gas mixture comprising approximately 50 to 150 sccm of LTO520 and approximately 50 to 150 sccm of argon (Ar) to a plasma chamber (e.g., a CCP or ICP chamber) in which the patterned substrate 100 is disposed. Other gas mixtures may also be used. The gas mixture may be supplied to the plasma chamber at zero source power (0 W), zero bias power (0 W), relatively high chamber pressure (e.g., 200 to 400 mT) and relatively high temperature (e.g., 30 to 100° C.). Other process conditions may also be used.

In some embodiments, the ACL etch process 312 may continue after the silicon monolayer is formed in FIG. 3C. For example, the ACL etch process 312 may continue etching the exposed portions of ACL 306 until the exposed portions are completely removed, as shown in FIG. 3E.

Figure 3D:
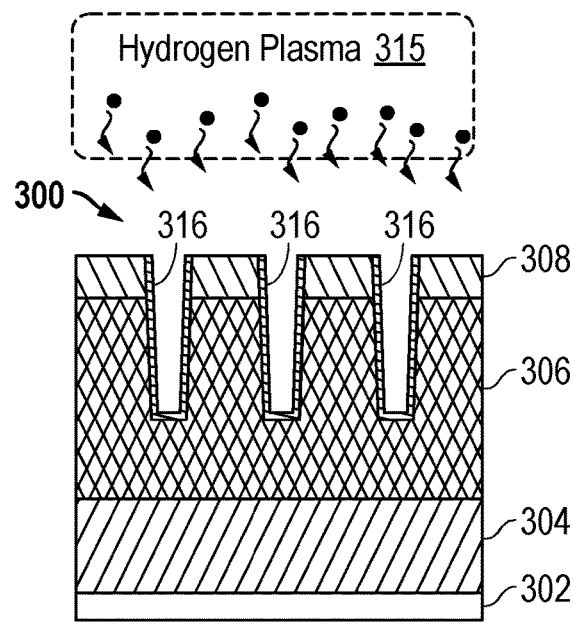
Figure 3E:
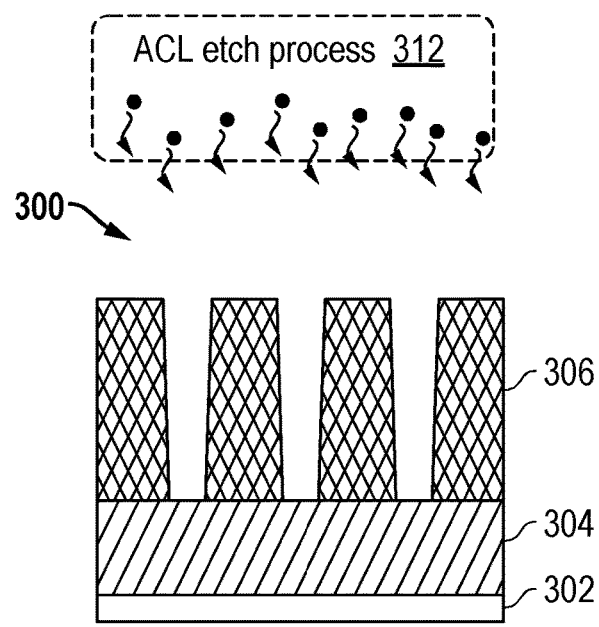

In other embodiments, the processing steps shown in FIGS. 3C and 3E may be repeated a number of cycles and/or until the exposed portions of the ACL 306 are completely removed. For example, after partially etching the exposed portions of ACL 306 to the first depth (d1) in FIG. 3B and forming a silicon monolayer on the sidewall surfaces of the openings 310 in FIG. 3C, the ACL etch process 312 may continue etching the exposed portions of the ACL 306 to a second depth (not shown), which is greater than the first depth (d1). If the second depth is less than the thickness (T) of the ACL 306, the processing steps shown in FIGS. 3C and 3E may be repeated to form another silicon monolayer on the sidewall surfaces of the openings 310 and continue etching of the exposed portions of the ACL 306. This process may be repeated for a number of cycles (e.g., 5 to 15) and/or until the exposed portions of the ACL 306 are completely removed, as shown in FIG. 3E.

In other embodiments, the silicon-containing passivation layer 316 may be formed by: (a) exposing the patterned substrate 100 to the silicon-containing precursor 314 in the absence of plasma to deposit a silicon monolayer on the sidewall surfaces of the openings 310, as shown in FIG. 3C, (b) subsequently exposing the patterned substrate 100 to a hydrogen plasma 315, as shown in FIG. 3D, and (c) repeating the steps of exposing the patterned substrate 100 to the silicon-containing precursor 314 in the absence of plasma (FIG. 3C) and subsequently exposing the patterned substrate 100 to a hydrogen plasma 315 (FIG. 3D) a number of times (e.g., 2 to 6) to build up or form a plurality of silicon monolayers on the sidewall surfaces of the openings 310.

In one example embodiment, the hydrogen plasma 315 may be generated by supplying approximately 100 to 300 sccm of hydrogen ($H_2$) to a plasma chamber (e.g., a CCP or ICP chamber) in which the patterned substrate 100 is disposed. Other hydrogen containing gases may also be used. The hydrogen containing gas may be supplied to the plasma chamber at relatively high source power (e.g., 300 to 700 W), little to no bias power (e.g., 0 W), relatively low chamber pressure (e.g., 30 to 70 mT) and relatively high temperature (e.g., 50 to 100° C.). High chamber pressures (e.g. 100 to 500 mT) may also be utilized. Other process conditions may also be used. Other hydrogen-containing gases, such as for example, ammonia ($NH_3$) may be utilized and inert gases (such as Ar, N2, He, Ne, Kr, Xe) may alternatively be used or added to the gas flow. N₂ plasma processes may also be utilized.

Exposing the patterned substrate 100 to the hydrogen plasma 315 allows the thickness of passivation layer 316 to increase. The increase may result from various mechanisms, such as for example, but not limited to, surface property changes that allow the buildup of additional silicon monolayers, more complete silicon coverage due to making unabsorbed sites more active, etc. This results in the formation of a substantially thicker passivation layer 316, which provides better sidewall protection when the ACL etch process 312 resumes than can be provided with a single silicon monolayer. However, exposure to the hydrogen plasma 315 does not convert the silicon monolayer to another material, such as an oxide or nitride. This enables improved throughput as opposed to ALD techniques.

In some embodiments, the ACL etch process 312 may continue in FIG. 3E after the plurality of silicon monolayers are formed in FIG. 3D. For example, the ACL etch process 312 may continue etching the exposed portions of the ACL 306 until the exposed portions are completely removed, as shown in FIG. 3E.

In other embodiments, the processing steps shown in FIGS. 3C, 3D and 3E may be repeated a number of cycles and/or until the exposed portions of the ACL 306 are completely removed. For example, after partially etching the exposed portions of ACL 306 to the first depth (d1) in FIG. 3B and forming a plurality of silicon monolayers on the sidewall surfaces of the openings 310 in FIGS. 3C and 3D, the ACL etch process 312 may continue etching the exposed portions of ACL 306 to a second depth (not shown), which is greater than the first depth (d1). If the second depth is less than the thickness (T) of ACL 306, the processing steps shown in FIGS. 3C, 3D and 3E may be repeated to form another plurality of silicon monolayers on the sidewall surfaces of the openings 310 and continue etching the exposed portions of the ACL 306. This process may be repeated for a number of cycles and/or until the exposed portions of the ACL 306 are completely removed, as shown in FIG. 3E.

Figure 4:
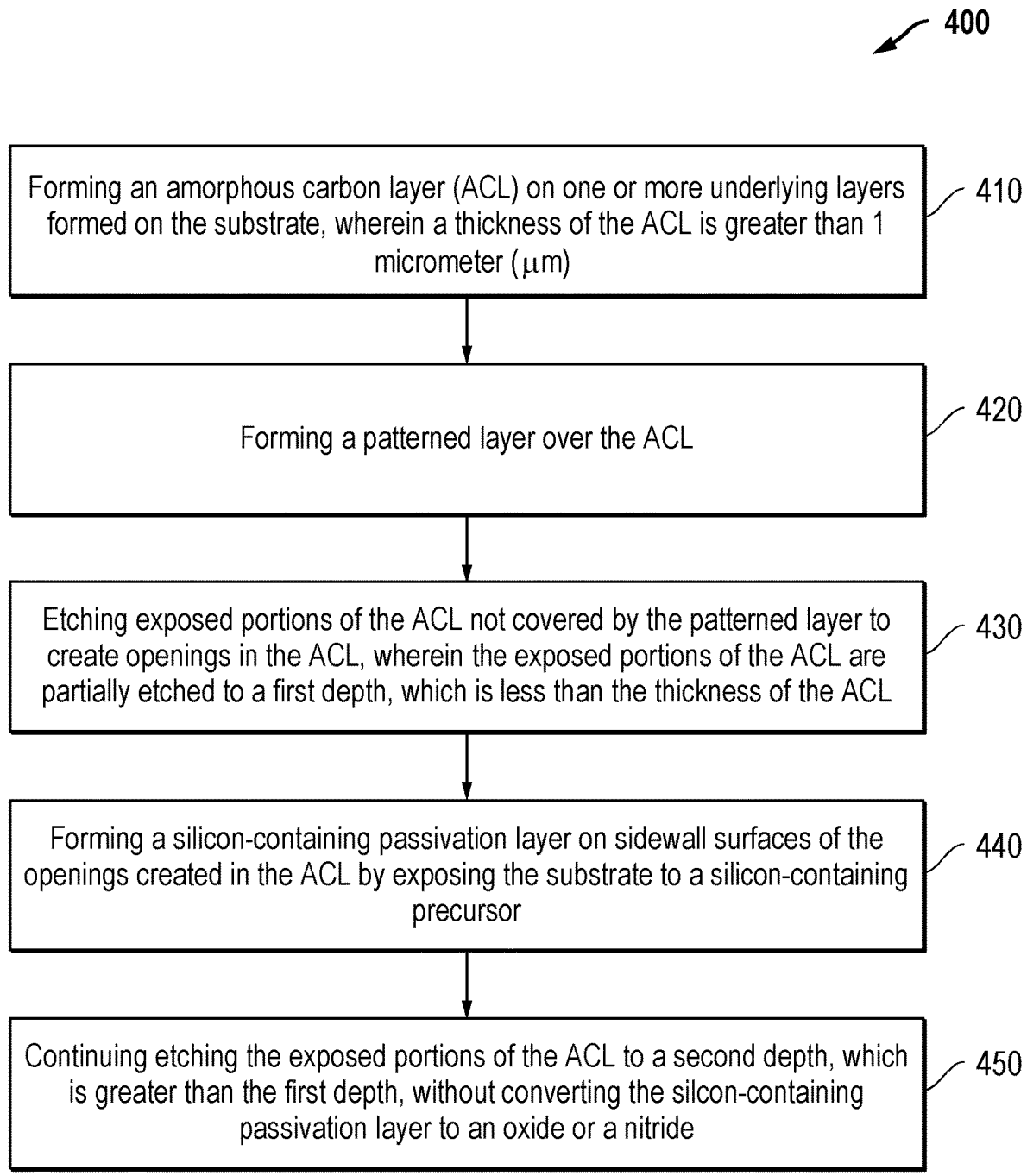
FIG. 4 is a flowchart diagram illustrating one embodiment of a method to pattern a substrate in accordance with the techniques described herein.
Figure 5:
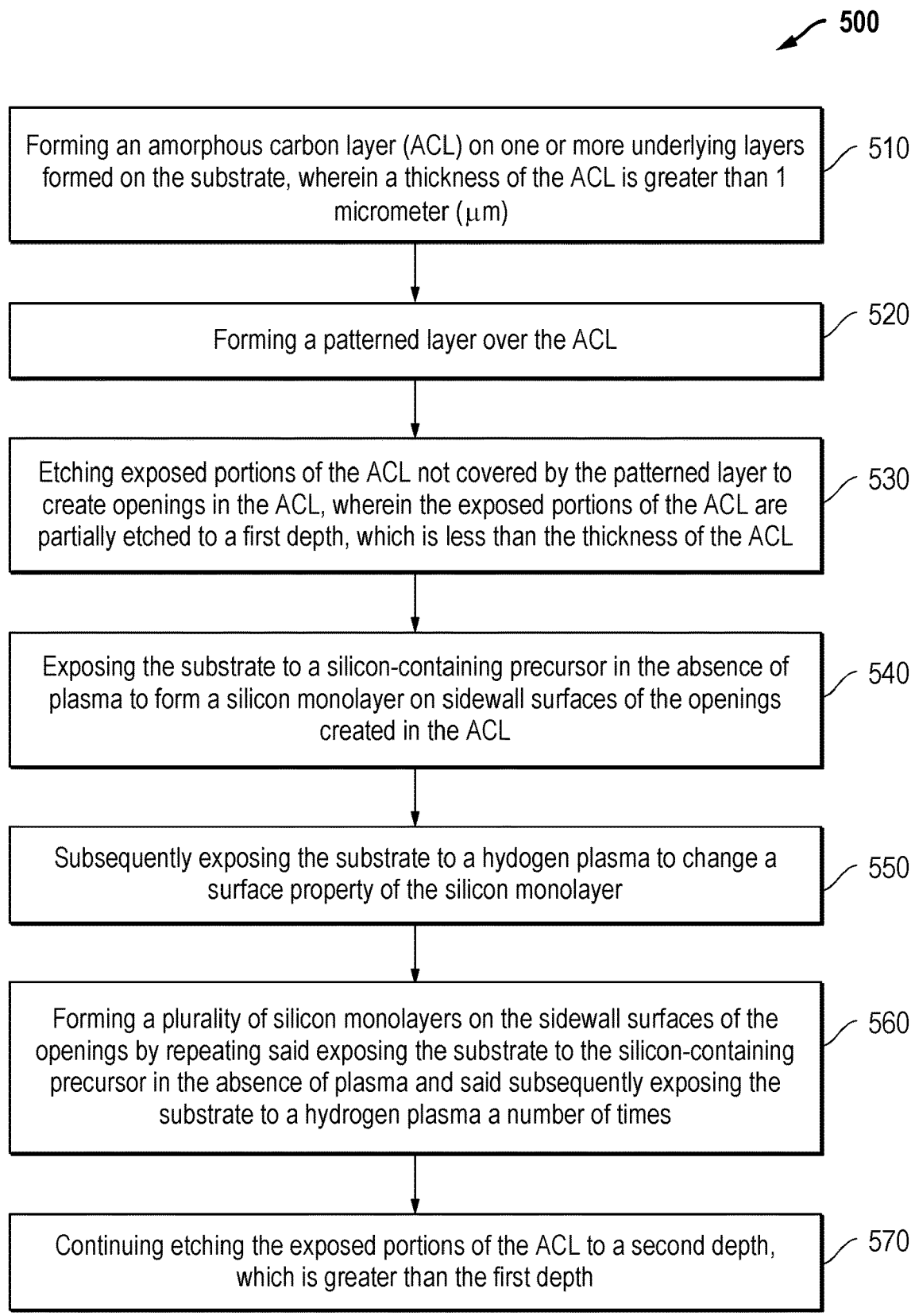
FIG. 5 is a flowchart diagram illustrating another embodiment of a method to pattern a substrate in accordance with the techniques described herein.

FIGS. 4-5 illustrate exemplary methods for use of the processing techniques described herein. It will be recognized that the embodiments of FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

FIG. 4 illustrates one embodiment of a method 400 that may be used to pattern a substrate using the techniques disclosed herein. In some embodiments, the method 400 may generally include forming an amorphous carbon layer (ACL) on one or more underlying layers formed on the substrate (in step 410), forming a patterned layer over the ACL (in step 420), and etching exposed portions of the ACL not covered by the patterned layer to create openings in the ACL, wherein the exposed portions of the ACL are partially etched to a first depth, which is less than a thickness of the ACL (in step 430). In some embodiments of the method 400, the thickness of the ACL may be greater than 1 micrometer (μm). For example, the thickness of the ACL may range between 1 μm and 4 μm.

Further, the method 400 may include forming a silicon-containing passivation layer on sidewall surfaces of the openings created in the ACL by exposing the substrate to a silicon-containing precursor (in step 440). For example, the silicon-containing passivation layer may be formed (in step 440) by exposing the substrate to the silicon-containing precursor in the absence of plasma to deposit a silicon monolayer on the sidewall surfaces of the openings created in the ACL. After the silicon monolayer is deposited on the sidewall surfaces of the openings, the method 400 may continue etching the exposed portions of the ACL to a second depth, which is greater than the first depth, without converting the silicon-containing passivation layer to an oxide or a nitride (in step 450). In some embodiments, method 400 may repeat said forming a silicon-containing passivation layer on sidewall surfaces of the openings (in step 440) and said continuing etching the exposed portions of the ACL (in step 450) for a number of cycles and/or until the exposed portions of the ACL are completely removed.

FIG. 5 illustrates another embodiment of a method 500 that may be used to pattern a substrate using the techniques disclosed herein. In some embodiments, the method 500 may generally include forming an amorphous carbon layer (ACL) on one or more underlying layers formed on the substrate, wherein a thickness of the ACL is greater than 1 micrometer (μm) (in step 510), forming a patterned mask layer over the ACL (in step 520), and etching exposed portions of the ACL not covered by the patterned mask layer to create openings in the ACL, wherein the exposed portions of the ACL are partially etched to a first depth, which is less than the thickness of the ACL (in step 530).

The method 500 may further include exposing the substrate to a silicon-containing precursor in the absence of plasma to form a silicon monolayer on sidewall surfaces of the openings created in the ACL (in step 540), subsequently exposing the substrate to a hydrogen plasma to change a surface property of the silicon monolayer (in step 550), and forming a plurality of silicon monolayers on the sidewall surfaces of the openings by repeating said exposing the substrate to the silicon-containing precursor in the absence of plasma and said subsequently exposing the substrate to a hydrogen plasma a number of times (in step 560). After the plurality of silicon monolayers are formed on the sidewall surfaces of the openings, the method 500 may continue etching the exposed portions of the ACL to a second depth, which is greater than the first depth (in step 570). In some embodiments, method 500 may repeat said forming a plurality of silicon monolayers on the sidewall surfaces of the openings (in step 560) and said continuing etching the exposed portions of the ACL (in step 570) for a number of cycles and/or until the exposed portions of the ACL are completely removed.

The process flow shown in FIGS. 3A-3E and the methods shown in FIGS. 4-5 prevent bowing during ACL etch processes by providing improved methods for forming a silicon-containing passivation layer on sidewall surfaces of openings formed in the ACL. Unlike conventional process flows and methods, the silicon-containing passivation layer disclosed herein is formed without utilizing atomic layer deposition (ALD) techniques or converting the silicon-containing passivation layer to an oxide or nitride. As such, the process flows and methods described herein can be used to protect the sidewall surfaces of the ACL and prevent bowing during ACL etch processes, while also reducing processing time and improving throughput.

Figure 6C:
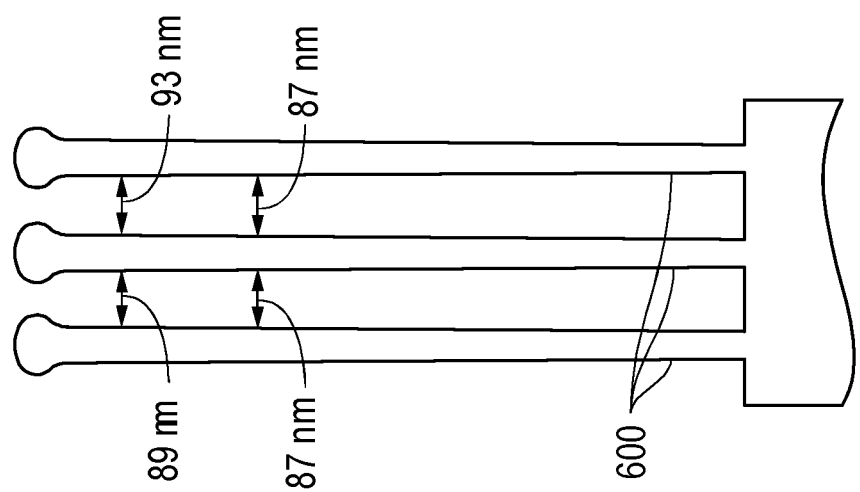
FIGS. 6A-6C are cross-sectional views of a patterned substrate after an ACL etch process is performed comparing the bow CD produced with and without the techniques described herein.
Figure 6B:
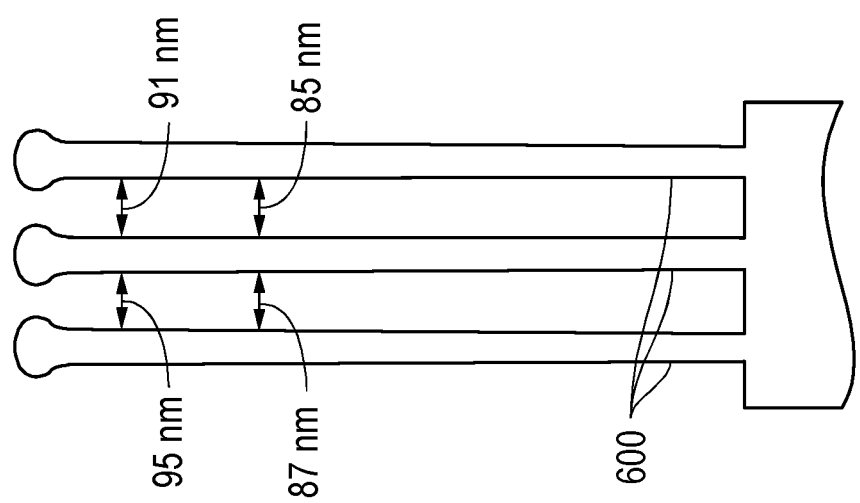
Figure 6A:
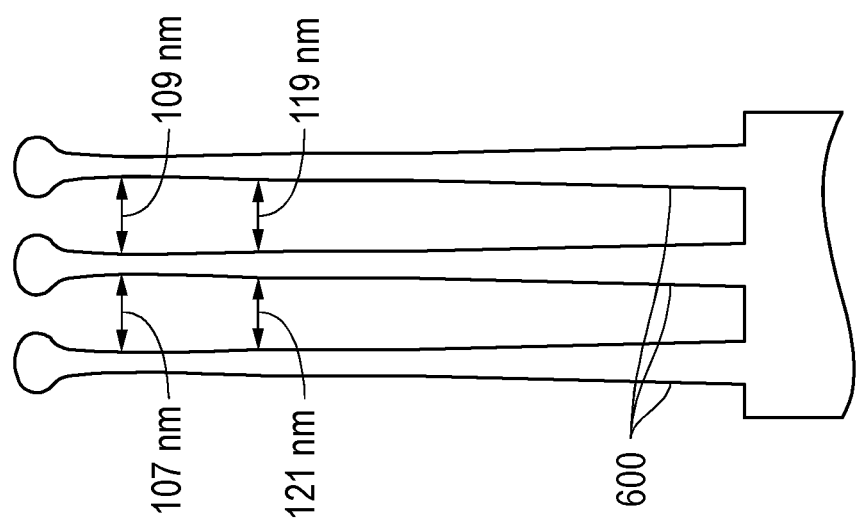

FIGS. 6A-6C are cross-sectional views of various amorphous carbon layers (ACLs) after an ACL etch process has performed to create openings in the ACL, illustrating the bow CD produced with and without the techniques described herein. In FIG. 6A, openings are created within ACL 600 without utilizing the techniques described herein. For example, ACL 600 having a thickness of approximately 3800 nanometers (nm) is etched using a conventional $SO_2/O_2$ etch chemistry without sidewall passivation in FIG. 6A. When such conventional processes are used, lateral etching of the sidewall surfaces of the ACL 600 causes significant bowing. For example, and as shown in FIG. 6A, a bow CD of approximately 107 to 109 nm is produced near the top of the ACL 600 and a bow CD of approximately 119 to 121 nm is produced at approximately a third of the way down the structure when using a conventional $SO_2/O_2$ etch chemistry without sidewall passivation.

Figure 7:
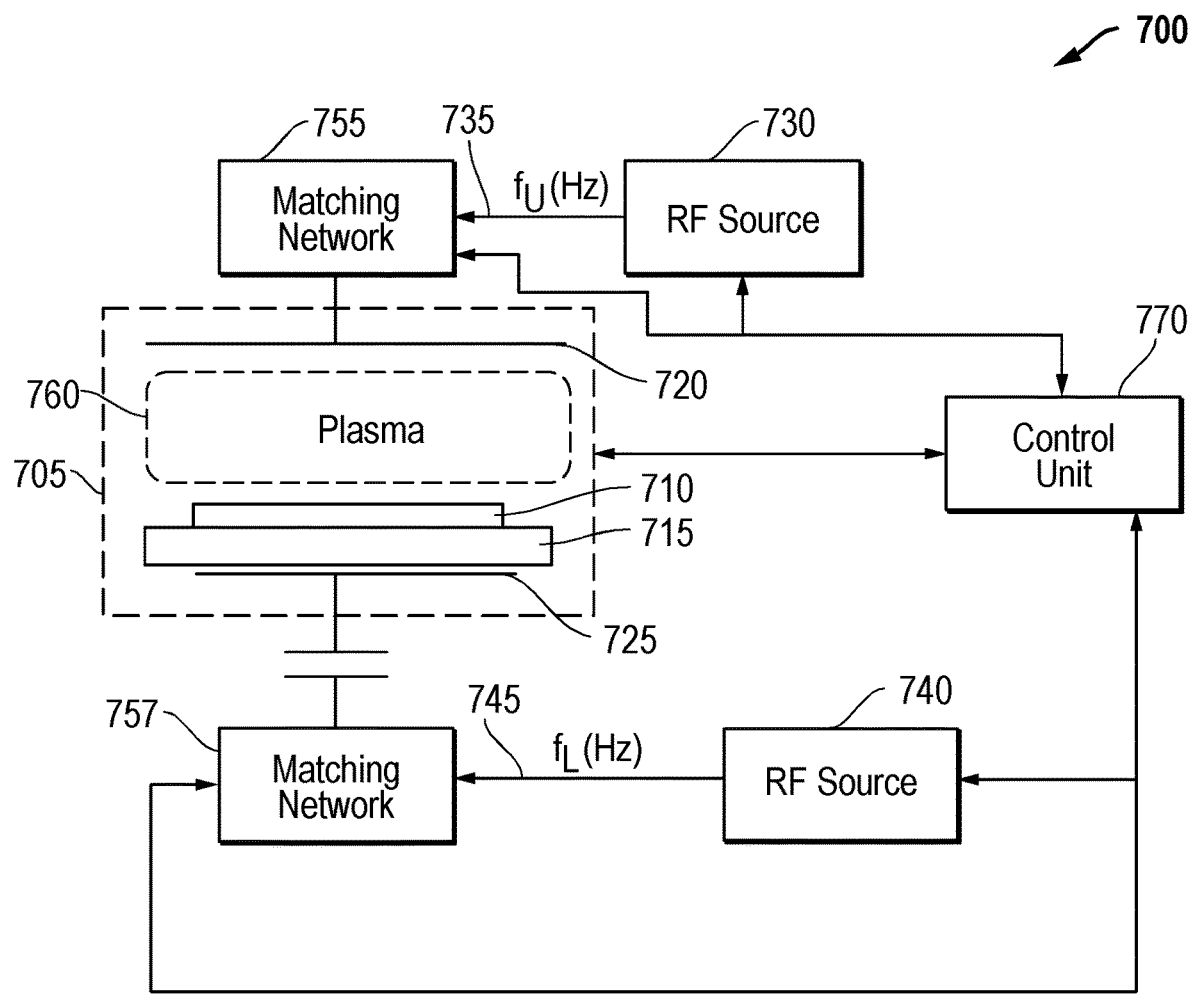
FIG. 7 is a block diagram illustrating one embodiment of a plasma processing system that may be used to pattern a substrate using the techniques described herein.

FIGS. 6B and 6C compare the openings created within an amorphous carbon layer when the techniques described herein are used. More specifically, FIG. 6B illustrates the bow CD produced when an ACL 600 having a thickness of approximately 3800 nm is etched using the process flow shown in FIGS. 3B, 3C and 3E. In FIG. 6B, the etch/deposition/etch process flow of FIGS. 3B, 3C and 3E was repeated ten times. FIG. 6C illustrates the bow CD produced when an ACL 600 having a thickness of approximately 3800 nm is etched using the process flow shown in FIGS. 3B, 3C, 3D and 3E. In FIG. 6C, for each step of forming the passivation layer, the passivation layer was formed by repeating the LTO/hydrogen plasma steps three cycles and the overall process of etch/deposition/etch was performed ten times. As shown in FIGS. 6B and 6C, the improved process flow and methods disclosed herein produce much less bowing, and thus, a smaller bow CD (e.g., approximately 89 to 95 nm) than that produced using conventional techniques. As shown in FIG. 6B, a bow CD of approximately 95 to 91 nm is produced near the top of the ACL 600 and a bow CD of approximately 87 to 85 nm is produced at approximately a third of the way down the structure. As shown in FIG. 6C, a bow CD of approximately 89 to 93 nm is produced near the top of the ACL 600 and a bow CD of approximately 87 nm is produced at approximately a third of the way down the structure. Typical CDs at the bottom of the structure may be 60 to 70 nm, though such CDs are merely exemplary FIG. 7 provides one example embodiment for a plasma processing system 700 that can be used with respect to the disclosed techniques and is provided only for illustrative purposes. Although the plasma processing system 700 shown in FIG. 7 is a capacitively coupled plasma (CCP) processing system, one skilled in the art would recognize the techniques described herein could be performed in an inductively coupled plasma (ICP) processing system, microwave plasma processing system, Radial Line Slot Antenna (RL-SATM) microwave plasma processing system, electron cyclotron resonance (ECR) plasma processing system, or other type of processing system or combination of systems. Thus, it will be recognized by those skilled in the art that the techniques described herein may be utilized with any of a wide variety of plasma processing systems.

The plasma processing system 700 can be used for a wide variety of operations including, but not limited to, etching, deposition, cleaning, plasma polymerization, plasma-enhanced chemical vapor deposition (PECVD), and so forth. The structure of a plasma processing system 700 is well known, and the particular structure provided herein is merely of illustrative purposes. It will be recognized that different and/or additional plasma process systems may be implemented while still taking advantage of the techniques described herein.

Looking in more detail to FIG. 7, the plasma processing system 700 may include a process chamber 705. As is known in the art, process chamber 705 may be a pressure controlled chamber. A substrate 710 (in one example a semiconductor wafer) may be held on a stage or chuck 715. An upper electrode 720 and a lower electrode 725 may be provided as shown. The upper electrode 720 may be electrically coupled to a first radio frequency (RF) source 730 through a first matching network 755. The first RF source 730 may provide a source voltage 735 at an upper frequency ($f_U$) to the first matching network 755. The lower electrode 725 may be electrically coupled to a second RF source 740 through a second matching network 757. The second RF source 740 may provide a bias voltage 645 at a lower frequency ($f_L$) to the second matching network 757. Though not shown, it will be known by those skilled in the art that a voltage may also be applied to the chuck 715.

Components of the plasma processing system 700 can be connected to, and controlled by, a control unit 770 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber 705 with various microfabrication techniques. It will be recognized that control unit 770 may be coupled to various components of the plasma processing system 700 to receive inputs from and provide outputs to the components.

The control unit 770 can be implemented in a wide variety of manners. For example, the control unit 770 may be a computer. In another example, the control unit 770 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed process recipe. It is further noted that the software or other programming instructions can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

During some processing steps, the plasma processing system 700 may apply power from the first RF source 730 and the second RF source 740 to the upper and lower electrodes to generate a plasma 760 in the process chamber 705. When a plasma 760 is generated within the process chamber 705, ions within the plasma 760 are attracted to the substrate 710. The generated plasma 760 can be used for processing a target substrate (such as substrate 710 or any material to be processed) in various types of treatments such as, but not limited to, plasma etching, deposition and/or sputtering. For example, plasma 760 may be generated within the process chamber 705 to perform one or more of the process steps shown in FIGS. 3B, 3D and 3E. As noted above, however, other processing steps described herein may process the target substrate without generating a plasma. For example, the silicon-containing passivation layer 316 may be formed on the sidewall surfaces of the openings 310 in the absence of plasma.

In the CCP processing system shown in FIG. 7, application of power results in a high-frequency electric field being generated between the upper electrode 720 and the lower electrode 725. Processing gas delivered to process chamber 705 can then be dissociated and converted into the plasma 760. As shown in FIG. 7, the exemplary plasma processing system 700 described herein utilizes two RF sources. In an exemplary embodiment, the first RF source 730 provides source power at relatively high frequencies to convert the processing gas(es) delivered into the process chamber 705 into the plasma 760 and to control the plasma density. The second RF source 740 provides a bias power at lower frequencies to control ion bombardment energy.

In one example plasma processing system, for example, the first RF source 730 may provide about 0 to 1400 W of source power in a high-frequency (HF) range from about 3 MHz to 150 MHz (or above) to the upper electrode 720, and the second RF source 740 may provide about 0 to 1400 W of bias power in a low-frequency (LF) range from about 0.2 MHz to 60 MHz to the lower electrode 725. Different operational ranges can also be used depending on type of plasma processing system and the type of treatments (e.g., etching, deposition, sputtering, etc.) performed therein.

In one exemplary embodiment, the ACL etch process 312 shown in FIGS. 3B and 3E may be performed with process conditions of 1000 W to 1400 W source power, 200 W to 600 W bias power, 10 mT to 30 mT pressure, 0° C. to 40° C. electrostatic chuck temperature, and a gas flow mixture of 150 sccm $SO_2$, 300 sccm $O_2$ and 50 sccm Ar.

In one exemplary embodiment, the deposition step shown in FIG. 3C may be performed with process conditions of 0 W source power, 0 W bias power, 200 mT to 400 mT pressure, 50° C. to 100° C. electrostatic chuck temperature, and a gas flow mixture of 100 sccm LTO520 and 100 sccm Ar.

In one exemplary embodiment, the plasma step shown in FIG. 3D may be performed with process conditions of 300 W to 700 W source power, 0 W bias power, 30 mT to 70 mT pressure (higher pressures may alternatively be utilized), 50° C. to 100° C. electrostatic chuck temperature, and 200 sccm $H_2$ gas flow.

It is noted that the techniques described herein may be utilized within a wide range of plasma processing systems. Although a particular plasma processing system 700 is shown in FIG. 7, it will be recognized that the techniques described herein may be utilized within other plasma processing systems. In one example system, the RF sources shown in FIG. 7 may be switched (e.g., higher frequencies may be supplied to the lower electrode 725 and lower frequencies may be supplied to the upper electrode 720). Further, a dual source system is shown in FIG. 7 merely as an example system. It will be recognized that the techniques described herein may be utilized with other plasma processing systems in which a modulated RF power source is provided to one or more electrodes, direct current (DC) bias sources are utilized, or other system components are utilized. It is further recognized that other plasma processing systems, such as an ICP processing system may also be used to perform one or more of the various deposition and etch processes described herein.

It is noted that various deposition and etch processes can be used to form one or more of the material layers shown and described herein. For example, one or more depositions can be implemented using chemical vapor deposition (e.g., CVD, PECVD), physical vapor deposition (PVD), plasma deposition (e.g., CCP, ICP), spin-on processes, atomic layer deposition (ALD), and/or other deposition processes. In one example deposition process, a gas mixture including but not limited to LTO520, is utilized. However, other aminosilanes and/or silicon-containing precursor gases may also be used. The process may optionally include a combination with one or more dilution gases (e.g., argon, nitrogen, etc.). The process may occur at a variety of pressure, power, flow, and temperature conditions to form a silicon-containing passivation layer on sidewall surfaces of openings formed in an amorphous carbon layer.

It is further noted that various etch processes can be used to etch one or more of the material layers shown and described herein. For example, one or more etch processes can be implemented using plasma etch processes, discharge etch processes, and/or other desired etch processes. In one example plasma etch process, a gas mixture including but not limited to $SO_2$ and $O_2$ optionally in combination with one or more dilution gases (e.g., argon, nitrogen, etc.) can be used at a variety of pressure, power, flow and temperature conditions to etch the exposed portions of the amorphous carbon layer.

Other operating variables for process steps can also be adjusted to control the various deposition and/or etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method comprising:
    forming an amorphous carbon layer (ACL) on one or more underlying layers formed on the substrate, wherein a thickness of the ACL is greater than 1 micrometer (µm);
    forming a patterned mask layer over the ACL;
    etching exposed portions of the ACL not covered by the patterned mask layer to create openings in the ACL, wherein the exposed portions of the ACL are partially etched to a first depth, which is less than the thickness of the ACL;
    forming a silicon-containing layer on sidewall surfaces of the openings created in the ACL; and
    subsequently exposing the substrate to hydrogen to change a surface property of the silicon layer.

2. The method of claim 1, wherein the silicon-containing layer is a silicon monolayer, the method further comprising forming a plurality of additional silicon monolayers on the sidewall surfaces of the openings by repeatedly:
    exposing the substrate to a silicon-containing precursor in the absence of plasma, and
    exposing the substrate to a hydrogen plasma a number of times.

3. The method of claim 1, further comprising continuing etching the openings to a second depth, which is greater than the first depth.

4. The method of claim 1, further comprising forming additional silicon-containing layer on the sidewall surfaces of the openings and continuing etching the exposed portions of the ACL in additional openings formed by the silicon-containing layers until the portions of the ACL within the additional openings are completely removed.

5. The method of claim 1 wherein the forming a silicon-containing layer on sidewall surfaces of the openings and the subsequent step of exposing the substrate to hydrogen forms an etch passivation layer without converting the silicon-containing passivation layer to an oxide or a nitride.

6. The method of claim 1 wherein forming a silicon-containing layer comprises:
    exposing the substrate to a silicon-containing precursor in an absence of plasma to form a silicon monolayer on sidewall surfaces of the openings created in the ACL.

7. The method of claim 6, wherein a non-atomic layer deposition (ALD) process is used to deposit the silicon monolayer.

8. The method of claim 6, wherein said exposing the substrate to the silicon-containing precursor in the absence of plasma comprises:
    providing the substrate within a plasma chamber coupled to a first radio frequency (RF) source and a second RF source; and
    supplying the silicon-containing precursor to the plasma chamber without supplying power from the first RF source or the second RF to the plasma chamber.

9. The method of claim 8, wherein said providing the substrate within the plasma chamber comprises providing the substrate within a capacitively coupled plasma (CCP) chamber or an inductively coupled plasma (ICP) chamber.

10. The method of claim 2, wherein the silicon-containing precursor comprises an aminosilane.

11. The method of claim 2, wherein the silicon-containing precursor comprises di-isopropylaminosilane.

12. The method of claim 6, wherein the silicon-containing precursor comprises an aminosilane.

13. The method of claim 6, wherein the silicon-containing precursor comprises di-isopropylaminosilane.

14. The method of claim 2, wherein the exposing the substrate to hydrogen comprises exposing the substrate to a hydrogen plasma.

15. A method comprising:
    forming an amorphous carbon layer (ACL) on one or more underlying layers formed on the substrate, wherein a thickness of the ACL is greater than 1 micrometer (µm);
    forming a patterned mask layer over the ACL;
    etching exposed portions of the ACL not covered by the patterned mask layer to create openings in the ACL, wherein the exposed portions of the ACL are partially etched to a first depth, which is less than the thickness of the ACL;
    forming a passivation layer that is a non-oxide and a non-nitride on sidewall surfaces of the openings created in the ACL; and
    subsequently exposing the substrate to hydrogen to change a surface property of the silicon layer.

16. The method of claim 15, wherein the exposing the substrate to hydrogen comprises exposing the substrate to a hydrogen plasma.

17. The method of claim 15, further comprising continuing etching the openings to a second depth, which is greater than the first depth.

18. The method of claim 1, further comprising forming additional silicon-containing layer on the sidewall surfaces of the openings and continuing etching the exposed portions of the ACL in additional openings formed by the silicon-containing layers until the portions of the ACL within the additional openings are completely removed.

19. The method of claim 1 wherein forming a passivation layer comprises:
    exposing the substrate to a precursor in an absence of plasma to form a monolayer on sidewall surfaces of the openings created in the ACL.

20. The method of claim 19, wherein said exposing the substrate to the precursor in the absence of plasma comprises:
    providing the substrate within a plasma chamber coupled to a first radio frequency (RF) source and a second RF source; and
    supplying the precursor to the plasma chamber without supplying power from the first RF source or the second RF to the plasma chamber.

* * * * *